United States Patent [19]
Lechaton et al.

[11] 3,868,723
[45] Feb. 25, 1975

[54] INTEGRATED CIRCUIT STRUCTURE ACCOMMODATING VIA HOLES

[75] Inventors: John S. Lechaton, Wappingers Falls; Leo P. Richard, Hyde Park; Daryl C. Smith, Newburgh, all of N.Y.

[73] Assignee: International Business Machines Corporation, Armonk, N.Y.

[22] Filed: Dec. 13, 1973

[21] Appl. No.: 424,267

Related U.S. Application Data

[62] Division of Ser. No. 375,298, June 29, 1973, Pat. No. 3,804,738.

[52] U.S. Cl. ........................ 357/54, 357/65, 357/68, 204/192

[51] Int. Cl. ........................ H01l 11/00, H01l 15/00

[58] Field of Search ......... 317/234, 5, 5.3, 5.4, 235, 317/46.5; 204/192

[56] References Cited

UNITED STATES PATENTS

| | | | |
|---|---|---|---|
| 3,383,568 | 5/1968 | Cunningham | 317/234 M |
| 3,436,611 | 4/1969 | Perry | 317/234 N |
| 3,518,751 | 7/1970 | Waters et al. | 317/234 M |
| 3,576,668 | 4/1971 | Fenster et al. | 317/234 N |
| 3,663,277 | 5/1972 | Koepp et al. | 317/235 |

*Primary Examiner*—Andrew J. James
*Attorney, Agent, or Firm*—J. B. Kraft

[57] ABSTRACT

A method of partially planarizing an electrically insulative layer over an integrated circuit substrate which has a raised line metallization pattern having narrower lines and wider lines. The insulative layer has narrower and wider elevations corresponding to the underlying lines. Resputtering of said insulative layer is conducted for an amount of time sufficient to planarize the narrower elevations in the layer but insufficient to so planarize its wider elevations. This method is useful in planarizing insulative layer elevations through which via holes are to be formed, particularly via holes which are wider than the underlying metallizing lines which they contact. Such a planarization method in via hole formation avoids the tunneling effects which would otherwise result from the overchemical etching necessary to form the via holes.

3 Claims, 17 Drawing Figures

INTEGRATED CIRCUIT STRUCTURE ACCOMMODATING VIA HOLES

This is a division of application Ser. No. 375,298 filed June 29, 1973 now U.S. Pat. No. 3,804,738.

BACKGROUND OF INVENTION

The present invention relates to methods of sputtering and, more particularly, to methods of resputtering layers of electrically insulative material used in integrated semiconductor circuits. In the construction of thin film integrated semiconductor circuits wherein a passivating or insulating film or layer is sputter-deposited over a raised conductive line pattern, e.g., metallization pattern, on a substrate, the insulative film follows the contours of the underlying metallization pattern, i.e., the insulative layer will have raised portions or elevations corresponding to said pattern.

Copending application Ser. No. 103,250, R. P. Auyang et al., filed Dec. 31, 1970, and assigned to the assignee of the present invention, relates to a method of removing all elevations from a deposited insulative layer by resputtering to completely planarize the surface of the layer. Such complete planarization of insulative layers was considered to be particularly desirable in structures having several levels of metallurgy separated by several layers of insulative material. In such multi-layered structures, cumulative effects of several levels of raised metallization on the final insulative layer would be very pronounced and undesirable. Consequently, the advantage of completely planarizing each of the several insulative layers to avoid the overall cumulative effect is apparent. Such complete planarization by resputtering is very effective. However, it is time-consuming. For example, it takes up to about 24 hours of RF resputtering to completely planarize a conventional silicon dioxide layer deposited over a metallization pattern having raised lines in the order of 300 to 1500 micro-inches in width, a conventional width for present day large scale integrated circuit structures.

The phenomenon of resputtering, in general, is known in the art and involves the re-emission of deposited insulative material, such as $SiO_2$, during the sputter deposition thereof through the effects of attendant ion bombardment of the deposited insulative layer. The sputtering apparatus was first disclosed in the publication, "Thin Films Deposited by Bias Sputtering", L. I. Maissel et al., Journal of Applied Physics, Jan. 1965, p. 237, as a modified DC sputtering technique known as Biased Sputtering. The application of the principles of resputtering to RF sputtering is disclosed in an article, "Re-Emission Coefficients of Silicon and Silicon Dioxide Films Deposited Through RF and DC Sputtering", R. E. Jones et al., Journal of Applied Physics, Nov. 1967, p. 4656. In effect, resputtering is the positive ion bombardment of an insulative film during its deposition. The prior art has recognized that resputtering improves the quality of sputter deposited film; U.S. Pat. No. 3,661,761, discloses the use of RF sputtering to improve film quality and uniformity.

While resputtering has been used to some extent in the commercial fabrication of integrated circuits for the purpose of improving the quality of sputter deposited film, the use of resputtering for complete planarization has been quite limited because of the great amount of time necessary to achieve complete planarization of an insulative layer deposited over raised metallized line patterns of conventional width. While a conventional raised line metallization pattern will have lines of varying widths, the low resistance requirements of a great many of such lines in a given pattern, such as power distribution lines, will require wide metallization lines and, consequently, wide elevated portions in the insulative overlayer. Such wide elevations introduce a time factor in the planarization step which, in many cases, may render complete planarization impratical. Consequently, the use of complete planarization in the integrated circuit fabrication industry is fairly limited, and most of the industry tries to "live with" the insulative layer elevations resulting from the raised metallization pattern. Where only a few levels of metallization are needed in the integrated circuit, the accumulated effect of insulative layer elevations may still be tolerable.

Unfortunately, we have now found that even in structures where the accumulated effect of the insulative layer elevation is tolerable, such elevations producing a very significant disadvantage in forming a via hole through the insulative layer elevation to the underlying metallic line. As will be hereinafter described in greater detail with respect to FIGS. 1 through 1C, when the elevation in the insulative layer is chemically etched through to provide a via hole in accordance with standard techniques, the via opening being etched will reach the side of the metallic line and even the bottom of the metallic line before all of the insulative material above the line is removed. Then, while the remainder of the insulative material above the metallic line in the via hole is being removed, the tunneling effect by the etchant laterally along the side of the metallic line will take place which will result in an undesirable fissure which is a structural flaw in addition to being a defect through which subsequent etching steps may provide a short circuit path through any insulative layer underlying the metallic line to the semiconductor substrate. This tunneling effect is apparently due to a preferential etching phenomenon along the side of the line.

This problem is particularly pronounced in via hole structures wherein the via hole is wider than the underlying metallization. Present day and future integrated circuits having high density metallization require via holes which are at least as wide as and perferably wider than the metallization line to which the via hole extends. In earlier, less dense structures, it was a conventional practice to provide a metallization line under the via hole with expanded dimensions so as to form a metallic pad directly beneath the via hole which was substantially wider than the via hole. In such a case, since the underlying metal would be resistent to the chemical etchant, there would be little possibility of any significant downward etching even during the prolonged chemical etch times required for the via hole to pass through the elevation in the insulative layer. Consequently, the side of the line would never be reached and the tunneling effect would not take place. However, in present day integrated circuits having very dense metallization patterns, the use of expanded protective pads of metal beneath the via holes occupies valuable "real estate" which restricts the density of the metallization patterns and is, therefore, not practical. In the present day dense metallization structures, it is preferable for the metallization to be no wider than the via holes, and even more preferable for the via holes to be slightly wider than the underlying metallization line in order to insure complete opening of the hole and contact between the via hole and the line even in the case of slight misalignment. Because of such wider via holes, the previously described tunneling problem with respect to etching through the elevated portion of the insulative layer over the metallic line becomes significant.

SUMMARY OF THE INVENTION

Accordingly, it is a primary object of the present invention to provide a method for forming via holes through an insulative layer having elevations corresponding to an underlying conductive raised line pattern which is free of tunneling effects along the sides of the conductive lines.

It is another object of the present invention to provide a method for providing via holes through insulative layers having elevations corresponding to underlying metallization free from tunneling effects, which method utilizes planarization steps of relatively short duration.

It is a further object of the present invention to provide a method for forming via holes through an insulative layer having elevations, which via holes are wider than the raised metallization lines underlying said holes and are free of any undesirable tunneling effects.

It is yet a further object of the present invention to provide a novel multi-level metallization integrated circuit structure having a metallization arrangement which, in combination with the overlying insulative layer with limited elevated portions, will provide a structure substantially free of any tunneling effects.

The present invention provides a method of forming an electrically insulative layer over an integrated circuit substrate having a conductive raised line pattern, e.g., metallization pattern, formed thereon comprising the steps of forming on said substrate, a conductive raised line pattern having at least a portion of the line pattern narrower in width than the remainder of the pattern; then, depositing over said substrate an electrically insulative layer whereby said layer has narrower and wider raised portions corresponding to the underlying portions of said line pattern, and resputtering said insulative layer for an amount of time sufficient to planarize the narrower raised portions of said layer to the level of the unraised portions of the layer but insufficient to so planarize the wider raised portions of said layer. In carrying out this method, the metallization pattern is arranged so that the narrower line in the pattern will be at the positions at which the via holes are to be subsequently formed. Consequently, when the via holes are subsequently formed using conventional selective chemical etching, the insulative layer through which the via holes are to be formed, having been previously planarized, will be relatively shallow and close to the underlying metallization line. As a result, relatively short chemical etch times can be employed as compared to the etch times required if the overlying insulative layer were not planarized. With such short etch times, the tunneling effect produced by previously described prolonged etch time is avoided.

The selective partial planarization involved in the method of the present invention, wherein the elevations of the insulative layer over the narrow raised metallic lines where the via holes are to be formed are planarized while the elevations over the broader lines of the remainder of the metallization pattern remain unplanarized, is based upon the resputtering characteristic that the extent of lateral planarization of elevations in insulative layers is directly proportional to the time of the resputtering cycle.

The foregoing and other objects, features and advantages of the invention will be apparent from the following more particular description and preferred embodiments of the invention as illustrated in the accompanying drawings.

BRIEF DESCRIPTION OF THE DRAWINGS

FIGS. 2A′–2C′ are diagrammatic cross-sectional views of steps in the method of the present invention which may be used instead of steps 2A–2C.

DESCRIPTION OF THE PREFERRED EMBODIMENTS

Figure 1:
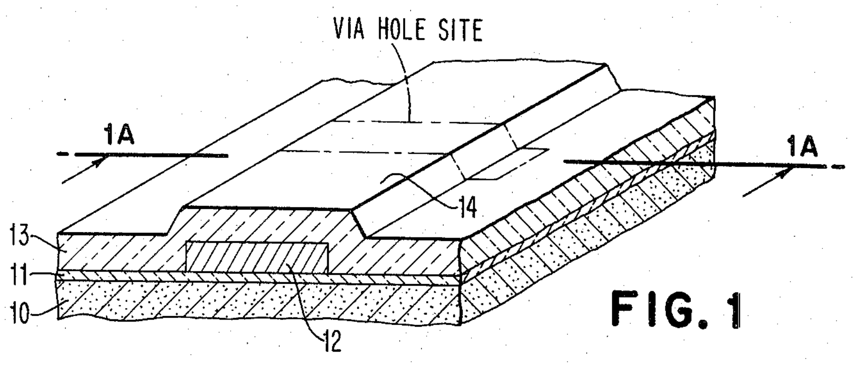
FIG. 1 is a partially sectioned perspective view and FIGS. 1A and 1B are diagrammatic cross-sections of a portion of an integrated circuit illustrating the tunneling effect problem when etching a via hole through an elevation in an insulative layer to an underlying metallization line.
Figure 1A:
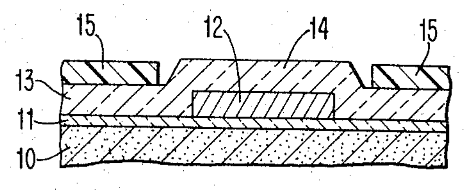
Figure 1B:
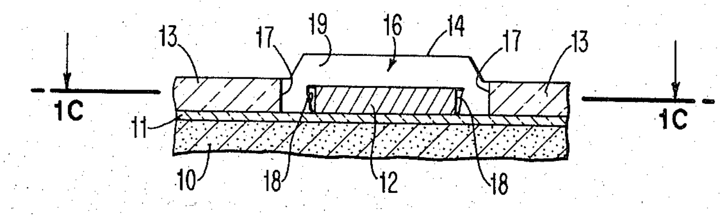
Figure 1C:
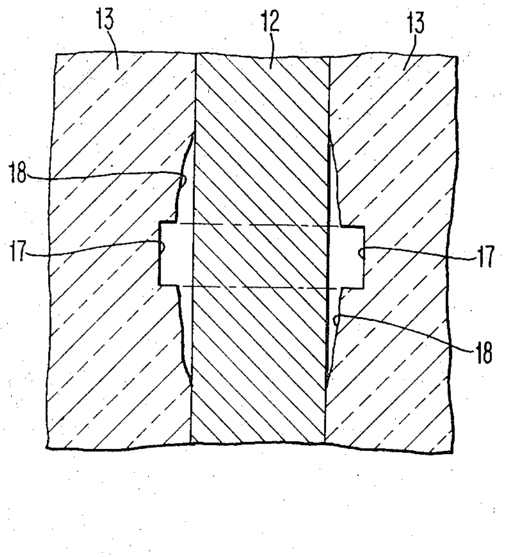
FIG. 1C is a horizontal sectional view along line 1C, 1C in FIG. 1B.

With reference to FIGS. 1–1C, there will now be described the problem which the method of the present invention solves. The structure of FIG. 1 is a portion of an integrated circuit chip showing the effect of a line in a metallization pattern on the insulative layer deposited over the metallization pattern. The structure may be formed by any conventional integrated circuit fabrication techniques, such as those described in U.S. Pat. No. 3,539,876. Silicon substrate 10 has formed theron a bottom layer of insulative material 11 which may be silicon dioxide formed by the thermal oxidation of the surface of substrate 10 or a material deposited by chemical vapor deposition or sputtering. Such materials include silicon dioxide, silicon nitride or aluminum oxide. Layer 11 acts to passivate or protect silicon substrate 10 as well as to insulate the substrate 10 from a metallization interconnection pattern of which line 12 is a portion. The metallization pattern is formed on layer 11 by conventional integrated circuit fabrication techniques as described in U.S. Pat. No. 3,539,876, e.g., by chemical etching or sputter deposition. The metallization pattern is selectively connected to devices at the surface of substrate 10 by connectors, not shown, selectively passing through insulative layer 11 to the substrate. The metallization pattern is covered by an overlayer 13 of insulative material, such as silicon dioxide, which protects and insulates the metallization pattern. Since it is necessary to selectively access lines 12 in the metallization pattern from above at selective sites in order to provide contacts for "off-chip" connections or to connect lines 12 with a second level metallization pattern to be deposited on insulative layer 13, the via holes must be made through insulative layer 13 to lines 12. Because conventional deposition techniques provide a layer 13 of substantially uniform thickness, the layer will contain elevations 14 corresponding to underlying metallization lines 12. The via holes must be formed through such elevations. A via hole which is to be opened is shown in phantom lines on layer 13. Standard techniques for forming such via holes involve defining the via holes with an etched resistant photoresist 15, as shown in FIG. 1A, followed by etching with a standard etchant for insulative material, as described in U.S. Pat. No. 3,539,876, until the top surface of metallization line 12 is exposed by the hole; a conventional etchant is buffered HF where insulative layer 13 is silicon dioxide. Metallization pattern 12 may be any conventional metal used in integrated circuits, such as aluminum, aluminum-copper alloys, platinum, palladium, chromium, or molybdenum, conventionally used in integrated circuits.

As has been previously mentioned, because of the increasing metallization line densities required in present and future integrated circuits, the earlier practice of having metallization lines of substantially expanded width so as to be considerably wider than the via holes at the via hole sites should be advantageously replaced by a structure in which via holes are as wide as or preferably slightly wider than the underlying metallization line. The opening in mask 15, FIG. 1A, is such that the via hole to be formed will be wider than the underlying metallization line 12. As shown in FIG. 1B, during the time required to chemically etch through elevation 14 to the surface of line 12, the via hole 16 will be etched completely through layer 13 at regions 17 where the via hole extends beyond the limits of metallization line 12. During the latter part of this etch period when the sides of metallization line 12 become exposed, a very undesirable phenomenon, the tunneling effect, takes place apparently due to a preferential etching effect wherein the etch rate of layer 13 along the sides of metallization line 12 is significantly greater than the etch rate in the remaining portions of this layer. This tunneling effect, which is shown more clearly when FIG. 1C, a horizontal sectional view through the structure of FIG. 1B, is read in combination with FIG. 1B, produces structural flaws 18 extending horizontally along the sides of metallization line 12 well beyond the limits of via hole 16 as defined by the rear wall 19 of this via hole. It has been found that even in forming via hole structures of the same width as the underlying metallization line 12, minor misalignment between the via hole and the underlying line which are completely within acceptable operation tolerances for the integrated circuits will produce a similar tunneling effect in areas where such minor misalignment causes the via hole to slightly overlap the side of the underlying metallization line.

Figure 2A:
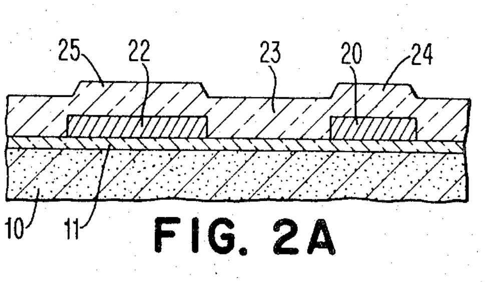
FIGS. 2A–2F are diagrammatic cross-sectional views of an integrated circuit chip illustrating the method of forming via holes in accordance with the present invention.
Figure 2A:
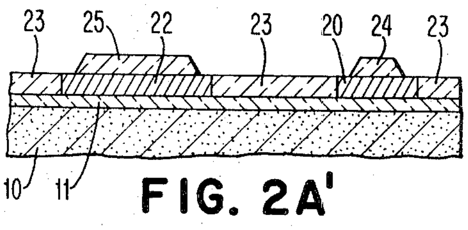

The method of the present invention which eliminates the tunneling problem will now be described with reference to FIGS. 2–2F. The method initially involves determining the lines in a given metallization pattern to which via holes must be formed and making these lines substantially narrower than the remaining lines in the pattern. As shown in the plan view in FIG. 2, a structure is formed as previously described except that metallization line 20, to which via hole 21, shown in phantom lines, is to be formed, is made substantially narrower than remaining metallization line as represented by line 22. The initial structure comprises, as shown in cross-sectional view 2A, a silicon substrate 10, a layer 11 which may be silicon dioxide or silicon nitride, as well as the metallization pattern. Then, in accordance with one embodiment of the present invention, silicon dioxide layer 23 is deposited utilizing conventional sputtering techniques and equipment to provide the structure shown in FIG. 2A. These techniques and equipment may conveniently be conventional RF sputtering approaches for the deposition of insulative material. However, since in the present method we are to subsequently utilize resputtering for partial planarization, equipment utilized to deposit initial layer 23, as shown in FIG. 2A, may be standard resputtering equipment which has been previously mentioned and will be subsequently described in greater detail. When utilizing such resputtering equipment for the initial deposition of layer 23, the equipment may be adjusted so that there is substantially little or no re-emission or removal of material from the layer being deposited, and the cycle is primarily one of deposition only.

Figure 2B:
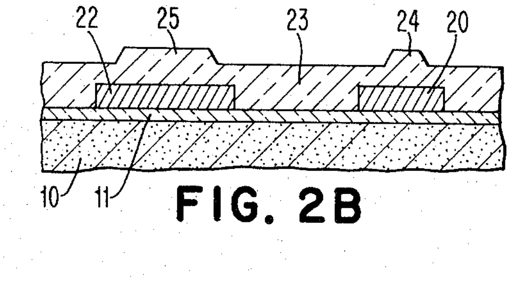
Figure 2B:
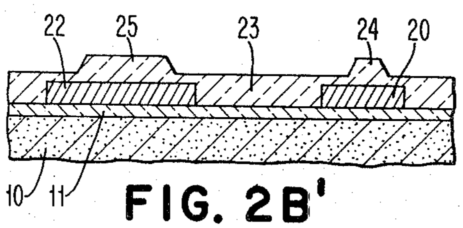

Next, utilizing standard resputtering equipment which may conveniently be prior art RF resputtering apparatus shown in FIG. 5, the operation of which will be hereinafter described in greater detail, insulative layer 23 is resputtered at a substantially zero deposition rate, i.e., the rate of deposition of insulative material onto layer 23 is equal to the rate of re-emission from layer 23. Under these conditions, the overal thickness of layer 23 will not change appreciably. However, both the narrower elevation 24 in this layer 23 over lines 20 and the wider elevation 25 over lines 22 will begin to narrow at the same rate inwardly from the edges. FIG. 2B shows the structure at an intermediate stage during resputtering wherein both elevations 24 and 25 have narrowed appreciably while the thickness of insulative layer 23 has remained substantially the same.

Figure 2C:
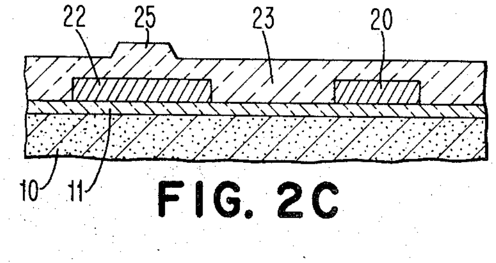
Figure 2C:
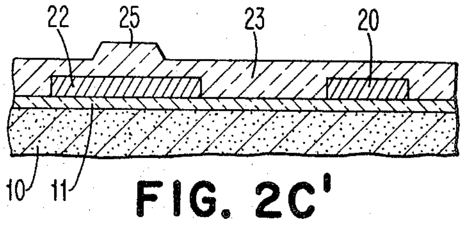

Upon the completion of the resputtering, as shown in FIG. 2C, we have the partially planarized structure in which elevation 25, although substantially narrowed, is still intact while elevation 24 over narrower metallization line 20 has virtually disappeared by planarization.

As an alternative to the partial planarization steps described in FIGS. 2A–2C, it is more preferable, instead of depositing insulative layer 23 completely and then resputtering for planarization, to conduct the deposition and planarization of layer 23 simultaneously as shown in FIGS. 2A'–2C'. The same conventional RF resputtering apparatus, as illustrated in FIG. 5, may be utilized for this simultaneous process. However, in conducting the deposition and resputtering simultaneously, the apparatus must be adjusted so that the rate of deposition of layer 23 exceeds the rate of re-emission from layer 23 as a result of resputtering. This will provide the gradual buildup of layer 23 shown in FIGS. 2A'–2C'. The structure at an early stage is shown in FIG. 2A'. The structure at an intermediate stage is shown in FIG. 2B' where there is a marked narrowing of elevations 24 and 25 in said layer. The resputtering is continued at the same rate until we have the structure shown in 2C' which is substantially the same as that in FIG. 2C. Insulative layer 23 has increased slightly in thickness to reach its required thickness while elevation 24 over metallization metalization line 20 has been substantially planarized to the overall level of layer 23.

Figure 5:
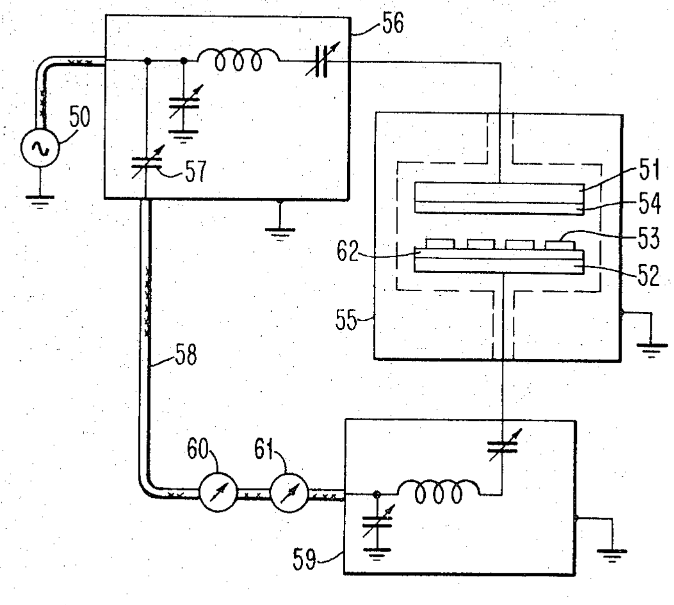
FIG. 5 (PRIOR ART)
FIG. 5 is a diagrammatic view of apparatus known in the art which may be utilized in the partial planarization resputtering step of the present invention.

As previously mentioned, prior art apparatus shown in FIG. 5 may be utilized in the partial planarization techniques of the present method. This apparatus was described in IBM Technical Disclosure Bulletin, September 1971, page 1032, in the publication "Power Networks for Substrate", R. P. Auyang et al. The RF sputtering system shown has a power splitting circuit for a driven RF system with independent controls for resputtering power and for the electrical phase between the cathode and the wafer holder. Briefly, RF generator 50 supplies power to target electrode 51 supporting a target 54 of the silicon dioxide material to be deposited on the integrated circuit wafers 53 supported on electrode 52. The electrodes and supporting structures are contained in a conventional vacuum chamber 55 which may conveniently be of the type shown in FIG. 1 of U.S. Pat. No. 3,661,761. Upper matching network 56 includes a coupling capacitor 57 having a magnitude of from 50 to 250 pF which permits continuous adjustment of the power splitting operation. Wafer holder/electrode 52 is driven by a matched 50 ohm. transmission cable 58. The lower matching network 59 transforms the input impedance of electrode 52 to a 50 ohm. load so that cable 58 functions as a delay line. The electrical phase between electrode 51 and electrode 52 is adjusted for the selected optimum sputtering condition by selecting the appropriate length for cable 58. Because the cable is matched, the effect of resputtering is easily monitored by forward and reflected power meters 60 and 61 as well as by controlling the D.C. bias on the substrate electrode 52. The apparatus of FIG. 5 is, in effect, a driven substrate system with a three-electrode arrangement wherein the chamber walls constitute the third grounded electrode. Consequently, the substrate holders must be isolated. A shielding arrangement should be used to avoid sputtering of unwanted material from the substrate holder. Accordingly, the wafers are placed on a thick quartz plate 62 covering the face of electrode 52. The driven substrate system is therefore operating in a "floating mode". The apparatus of FIG. 5 may be operated under the following average conditions: total power 4.0KW; electrode 51 power 2.7KW; electrode 52 power 1.3KW; chamber argon pressure 12 microns; delay line length 8 feet; spacing between electrodes 1.65 inches. Operating under the conditions described and utilizing a metallization system wherein the thickness of the metallization lines are 8000A and the final thickness of the level portions of silicon dioxide layer 23 is 21,000A, we have found that the rates of planarization by means of resputtering for elevations 24 and 25 above metallization lines 20 and 22 is about one minute for each micro-inch (250A) of width of metallization line. The narrower line 20 to which the via holes are to be subsequently formed in the present invention may, for example, be in the order of from 200 to 300 micro-inches (5 to 7.5 microns) in width. On the other hand, the wider line as represented by line 22 in the same metallization pattern may vary from 400 up to 1500 micro-inches, depending on the function which the line is to perform in the final integrated circuit; the power distribution line requiring the wider width. Accordingly, it should take in the order of 200 minutes to planarize elevation 24 over narrow line 20, while it should take up to 1500 minutes or 25 hours to achieve complete planarization of all elevations in insulative layer 23. It should be noted that the planarization rates are approximately of the same order if the procedures of FIGS. 2A–2C are carried out instead of that of FIGS. 2A'–2C'.

Figure 2D:
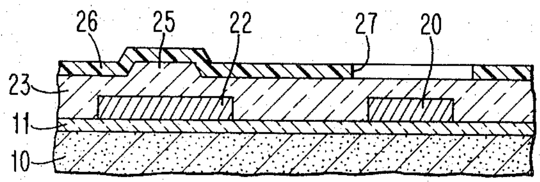
Figure 2E:
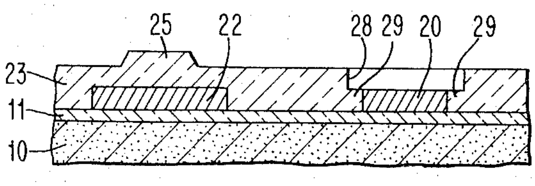

Next, utilizing conventional photolithographic selective etching techniques, as described in U.S. Pat. No. 3,539,876, a photoresist layer 26 is formed over partially planarized silicon dioxide layer 23 with openings 27 corresponding to the via holes to be formed, FIG. 2D. Next, using a conventional chemical etchant for silicon dioxide, such as buffered HF, via hole 28 is etched down to the upper surface of narrow metallic line 20 to provide the structure shown in FIG. 2E. Because the planarized portion of silicon dioxide layer 23 above metallic line 20 is narrower in thickness than the remainder of layer 23, 13,000A as compared to 21,000A, the previously described long conventional etch times are not required and the portion 29 of silicon dioxide layer beneath where via hole 28 overlaps the width of line 20 is not etched. As a result, the sides of line 20 are not exposed, and the undesirable tunneling effect is substantially eliminated.

Figure 2F:
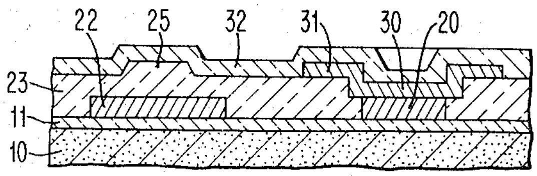

Next, as shown in FIG. 2F, appropriate metallization 30 is deposited in via hole 28; this metallization 30 is connected with a metallic pattern 31 which may provide another level of metallization on the surface of layer 23. The metal utilized for metallization 30 and 31 may be any one of the metals previously described as utilizable for metallization lines 20 and 22. An additional layer 32 of insulative material, such as silicon dioxide or silicon nitride, is deposited over layer 23 and the metallization.

Figure 2:
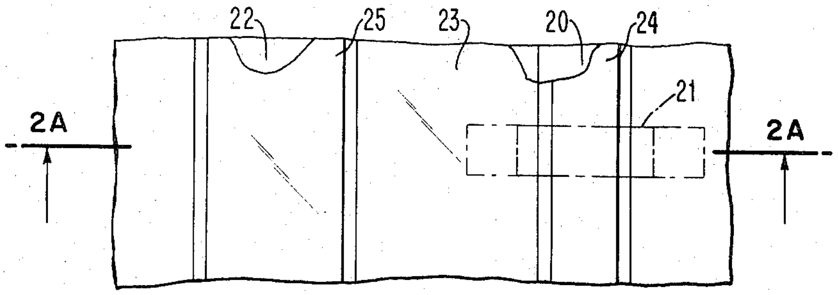
FIG. 2 is an illustrative top view of a portion of a planar surface of an integrated circuit chip illustrating a metallization arrangement with respect to a via hole site in accordance with the method of the present invention.

In forming the narrower metallization lines to which the via holes are to extend in accordance with the present invention, the narrower line may be narrow throughout as shown in FIG. 2. Alternatively, where current-carrying requirements for the line to which the via hole is to be formed are such that narrowing of the entire line would not be practical, the metallization line may have a narrowed portion only in the region where the via hole is to be formed. A diagram of such a line pattern is shown in the plan view of FIG. 3. In this view, line 33, to which the via hole is to be formed, is just as wide as a standard line 22. However, at the site in the line to which the via hole 34, shown in phantom lines, is to be made, the line narrows so that narrowed portion 35 beneath the via hole will have a width approximately the same as narrow line 20 in FIG. 2. In such a case, during the partial planarization step in the method of the present invention, only the narrowed portion 35 of line 33 will be planarized.

Figure 3:
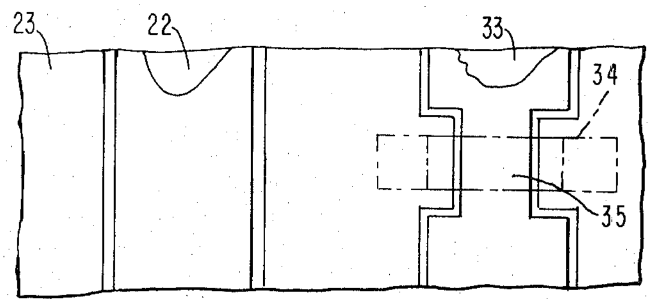
FIG. 3 is a diagrammatic top view of a portion of a surface of an integrated circuit chip illustrating a metallization line arrangement which may be used alternatively to that shown in FIG. 2.
Figure 4:
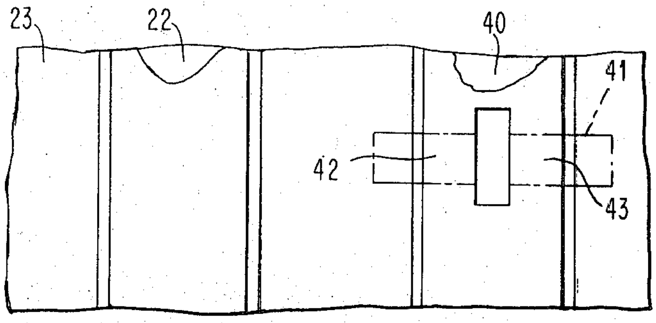
FIG. 4 is a diagrammatic top view of a portion of the surface of an integrated circuit chip illustrating still another metallization arrangement which may be utilized in the method of the present invention as an alternative to that shown in FIG. 2.

Under certain circumstances, the current-carrying characteristics required of a metallization line may be such that even the narrowing, as shown in FIG. 3, would not provide sufficient conductivity. In such a case, the present invention may be practiced using a structure diagrammatically shown in plan view in FIG. 4, wherein line 40, to which via hole 41 shown in phantom lines is to be made, has a standard width but is bidurcated into two lines 42 and 43 beneath the via hole. The via hole 41 will traverse and overlap both narrow lines 42 and 43. Lines 42 and 43 in the structure are sufficiently narrow so as to be planarizable in accordance with the resputtering cycle of the present invention in a relatively short time cycle. However, the current-carrying characteristics of line 40 are not significantly diminished because parallel lines 42 and 43 are capable of carrying almost as much current as line 40.

While the invention has been particularly shown and described with reference to preferred embodiments thereof, it will be understood by those skilled in the art that the foregoing and other changes in form and details may be made therein without departing from the spirit and scope of the invention.

What is claimed is:

1. In a planar semiconductor integrated circuit chip structure having a semiconductor member with a planar surface at which the devices in the circuit are formed and a metallization pattern selectively connected to said surface and disposed on a plurality of levels separated by layers of electrically insulative material above said surface, a via hole interconnected structure comprising a metallization line pattern on a first level with respect to said surface having line portions narrower in width than the remainder of the pattern, an electrically insulative layer covering said first level metallization pattern, via holes extending through said insulative layer to said narrower width line portions, said via holes being wider than and overlapping said line portions, a second level metallization pattern on said insulative layer, and metal interconnectors in said via holes connecting said first and second level patterns.

2. The integrated circuit structure of claim 1 wherein lines in said first level metallization pattern are necked-in proximate to the via holes to provide said narrower line portions.

3. The structure of claim 2 wherein lines in said first level metallization pattern are bifurcated proximate to the via holes to provide said narrower line portions, and the via hole at said bifurcated line is wider than and overlaps both of said line bifurcations.

* * * * *